(12) United States Patent
Mullen

(10) Patent No.: US 11,719,586 B2
(45) Date of Patent: Aug. 8, 2023

(54) ADDITIVE MANUFACTURED STRAIN GAUGE ON COMPONENT SURFACES FOR PREDICTIVE FAILURE MONITORING

(71) Applicant: Goodrich Corporation, Charlotte, NC (US)

(72) Inventor: James A. Mullen, Wadsworth, OH (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 17/656,532

(22) Filed: Mar. 25, 2022

(65) Prior Publication Data

US 2022/0214235 A1    Jul. 7, 2022

Related U.S. Application Data

(62) Division of application No. 16/132,986, filed on Sep. 17, 2018, now abandoned.

(51) Int. Cl.
| | | |
|---|---|---|
| *G01L 1/22* | (2006.01) | |
| *C09D 11/52* | (2014.01) | |
| *H01B 1/22* | (2006.01) | |
| *H05K 1/09* | (2006.01) | |
| *B33Y 80/00* | (2015.01) | |

(52) U.S. Cl.
CPC ............ *G01L 1/2287* (2013.01); *C09D 11/52* (2013.01); *G01L 1/22* (2013.01); *G01L 1/2206* (2013.01); *H01B 1/22* (2013.01); *H05K 1/097* (2013.01); *B33Y 80/00* (2014.12)

(58) Field of Classification Search
CPC ........ G01L 1/22; G01L 1/2206; G01L 1/2287
See application file for complete search history.

(56) References Cited

U.S. PATENT DOCUMENTS

| 4,210,216 A | * | 7/1980 | Godden | ................. | G01G 23/48 |
| | | | | | 177/245 |
| 9,462,700 B2 | | 10/2016 | Frankenberger | | |
| 9,546,928 B2 | | 1/2017 | Ward et al. | | |
| 9,964,455 B2 | | 5/2018 | Cheverton et al. | | |
| 9,990,576 B2 | | 6/2018 | Nardi et al. | | |
| 10,006,304 B2 | | 6/2018 | Schmidt et al. | | |
| 2006/0288794 A1 | | 12/2006 | Hardwicke et al. | | |
| 2010/0000441 A1 | | 1/2010 | Jang et al. | | |
| 2014/0144102 A1 | * | 5/2014 | Chen | ....................... | E04C 2/243 |
| | | | | | 428/223 |
| 2016/0196699 A1 | | 7/2016 | Chitty et al. | | |
| 2016/0290880 A1 | | 10/2016 | Lewis et al. | | |
| 2017/0226362 A1 | | 8/2017 | Fratello et al. | | |
| 2018/0038779 A1 | * | 2/2018 | Dehghan Niri | ...... | G01N 23/046 |

(Continued)

OTHER PUBLICATIONS

Extended European Search Report for EP Application No. 21189207.0, dated Dec. 3, 2021, pp. 7.

(Continued)

*Primary Examiner* — Paul M. West
(74) *Attorney, Agent, or Firm* — Kinney & Lange, P. A.

(57) ABSTRACT

An additively manufactured strain gauge resides on the surface of a component to monitor component fatigue. The strain gauge is additively manufactured, and applied to the curvature of the component surface through either a flexible substrate or through direct printing.

16 Claims, 3 Drawing Sheets

(56) References Cited

U.S. PATENT DOCUMENTS

2020/0029427 A1    1/2020    Joshi et al.

OTHER PUBLICATIONS

"Communication Pursuant to Article 94(3) EPC for EP Application No. 19197055.7", Communication Pursuant to Article 94(3) EPC for EP Application No. 19197055.7, Dated Jan. 22, 2021, pp. 4, 4.
"Extended European Search Report for EP Application No. 19197055.7,", Extended European Search Report for EP Application No. 19197055.7, dated Feb. 13, 2020, pp. 7, 7.

* cited by examiner

ADDITIVE MANUFACTURED STRAIN GAUGE ON COMPONENT SURFACES FOR PREDICTIVE FAILURE MONITORING

This application is a divisional of U.S. application Ser. No. 16/132,986 filed Sep. 17, 2018 for "ADDITIVE MANUFACTURED STRAIN GAUGE ON COMPONENT SURFACES FOR PREDICTIVE FAILURE MONITORING" by James A. Mullen.

BACKGROUND

This application relates generally to aircraft components and specifically to strain gauge monitoring of components.

Heated metallic or composite components in aircraft, such as floor panels, rotor blades, wing leading edges, stabilizers, and heated inlets can be subject to a high amount of stress and fatigue while being operated. These components should be monitored to ensure they do not fail while in flight. Ideally, upcoming failure should be predictable and the devices used to monitor such stresses should outlast the components themselves.

Conventional strain gauges used for component predictive failure monitoring have short lifespans. Conventional strain gauge, for example, use fine wires or very thin etched circuits that can have short operating lives, particularly in high strain environments, that do not lend themselves for use with predictive failure monitoring systems and algorithms.

SUMMARY

This application discloses strain gauges that are additively manufactured to provide sufficient operating lives that make them useful with predictive failure monitoring systems and algorithms.

In a first embodiment, an assembly includes a component have a top surface, a strain gauge additively manufactured thereon, and a controller. The strain gauge includes an additively manufactured portion comprising a conductive ink defining a sensing portion and one or more terminals and an encapsulating material, and one or more flex leads connected to the one or more terminals. The controller is electrically connected to the printed portion through the one or more flex leads.

In a second embodiment, a system for monitoring fatigue of a component includes an additively manufactured strain gauge on a first surface of a component, a controller for reading and analyzing data produced by the additively manufactured strain gauge, an electrical connection between the additively manufactured strain gauge and the controller, and a predictive program on the controller for predicting when the component will fail based on data from the additively manufactured strain gauge.

In a third embodiment, a method of making a strain gauge on a component includes additively manufacturing a gauge onto a first surface of the component and electrically connecting the gauge to an external controller.

DETAILED DESCRIPTION

An additively manufactured strain gauge will have a longer lifespan than a conventional wire or etched strain gauge due to the flexible nature of inks that are additively manufactured. This type of strain gauge could conceivably be printed directly into an aircraft component during manufacturing, allowing for a longer lifespan of the strain gauge device and extensive monitoring of stresses on the aircraft component. Examples of such aircraft components include but are not limited to floor panels, rotor blades, wing leading edges, horizontal stabilizers, vertical stabilizers, heated inlets, or other composite or metallic components for use in aircraft that are heated in use. A person of ordinary skill in the art would recognize that other aircraft components would also be compatible with the disclosed additively manufactured strain gauge.

A strain gauge with a long lifespan allows for long term component monitoring, prediction of component failure, and the creation of a predictive failure model based on raw strain gauge data. These models could allow for predictive failure of components where conventional strain gauges would fail too early to create such predictive models.

Figure 1:
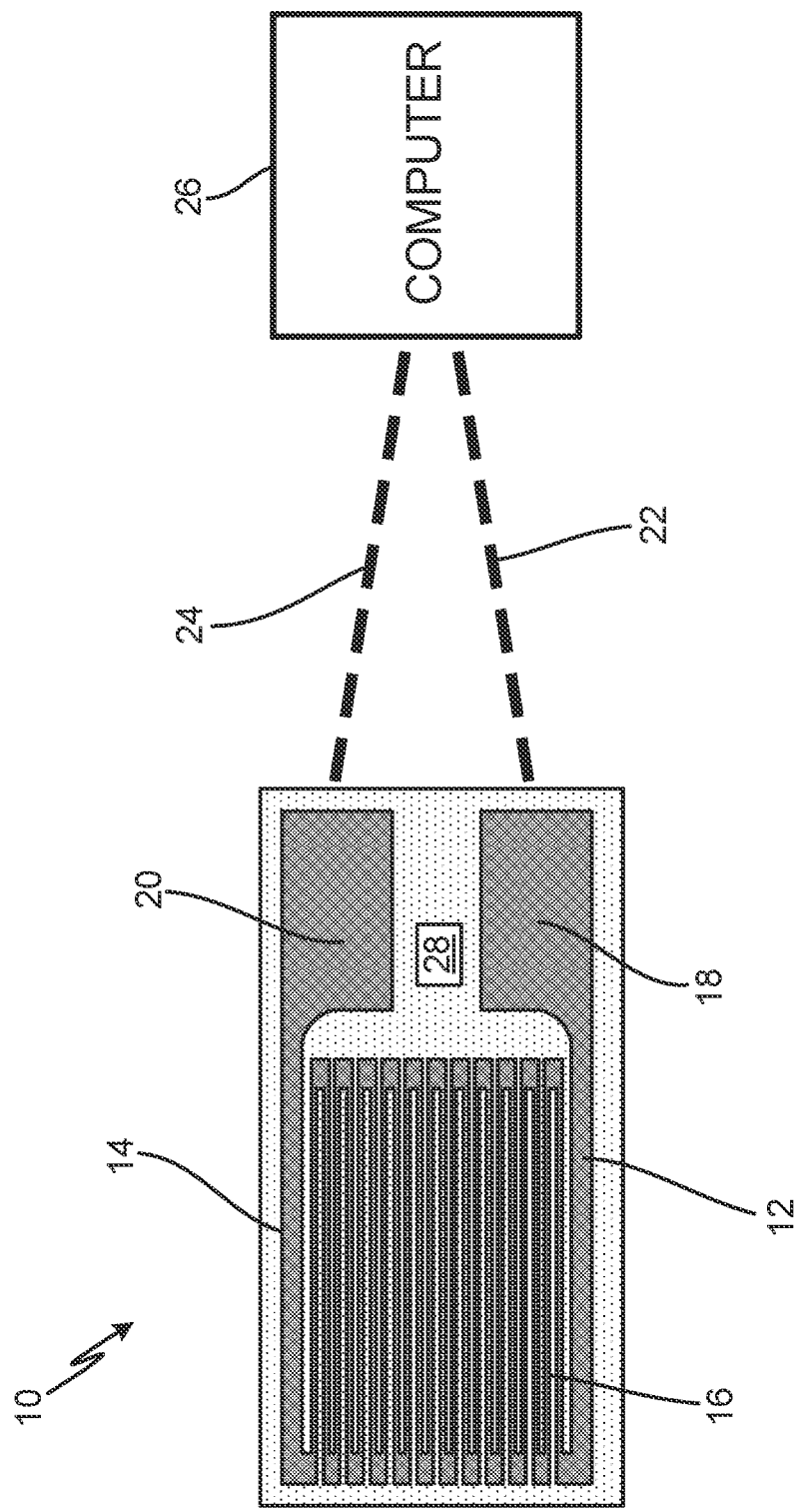
FIG. 1 is a top-down view of an additively manufactured strain gauge.

FIG. 1 is a top-down view of additively manufactured strain gauge 10. Strain gauge 10 has first side 12, second side 14, sensing portion 16, terminals 18, 20, and leads 22, 24 connecting strain gauge 10 to controller 26. Strain gauge 10 resides on dielectric layer 28.

Strain gauge 10 is a three-dimensional additively manufactured device made of a conductive ink within a resistivity range of between 0.01 and 20 ohms per square per MIL (where MIL=0.001 inch), or ideally between 1 and 15 ohms per MIL. The conductive ink can be, for example, carbon loaded, nano-carbon, or silver loaded ink. Some examples of conductive inks specialized for printed electronics are DuPont® PE410, DuPont® PE671, DuPont® PE873, Methode 9101, Methode 3800-series inks, Engineered Conductive Materials CI-2001, and Engineered Conductive Materials CI-2042. The conductive ink of strain gauge 10 is formulated to allow highly detailed precision printing, and maintain a high resistance without bleeding between adjacent additively manufactured lines. Strain gauge 10 is additively manufactured onto assembly 10 through a printing process such as screen printing, ink-jet, or aerosol-jet printing.

Sides 12, 14, and sensing portion 16 of strain gauge 10 are all made of conductive ink. Side 12, 14, define the outer limits of strain gauge 10, while sensing portion 16 is the sensing portion of strain gauge 10.

Terminals 18, 20, reside on opposite ends of sensing portion 16, and serve as "ends" to strain gauge 10, across which voltage is inputted and outputted, and change in resistance is measured. Leads 22, 24 create electrical connections between terminals 18, 20 and controller 26, allowing for effectively monitoring of strain of the component on which strain gauge 10 resides. Leads 22, 24 can be manufactured by conventional methods or alternatively additively manufactured along with the rest of strain gauge 10.

Dielectric layer 28 serves as a carrier for first side 12, second side 14, sensing portion 16, and terminals 18, 20, and prevents these conductive parts from shorting each other.

Strain gauge 10 is a sensor whose resistance varies with applied force. Strain gauge 10 converts force (pressure, tension, weight, etc.) into a change in electrical resistance which can be measured between terminals 18 and 20. When external forces are applied to a component on which strain gauge 10 is applied, stress/strain results. Stress is the component's internal resisting force, while strain is the displacement and deformation that occur within the component.

In practice, an excitation voltage is applied to strain gauge 10 through flex leads attached to terminals 18, 20, and a voltage reading is taken. Typical input voltages can be between 5 V and 12 V, whereas typical output readings can be in millivolts. Different applications place different requirements on strain gauge 10. In most cases, the orientation of strain gauge 10 is significant, and can affect readings from strain gauge 10. Typically, strain gauge 10 is laid across an axis on a surface of the component so that strain gauge 24 detects fatigue and stress typical to that component.

Strain gauge 10 can be manufactured in two ways: onto a flexible substrate, which is then applied to a component surface, or directly printed onto the component surface.

In the first method, a flexible substrate is prepared. The flexible substrate must be able to conform to the curvature of the component surface to which strain gauge 10 will be applied. The substrate can be, for example, neoprene, TPU, urethane, fabric, or other materials. In some instances, the substrate must be cleaned or cured before printing using conventional curing methods.

The substrate must be compatible with both the component and the conductive ink. For instance, the flexible substrate must be able to withstand heating occurring with the component, and maintain adhesion to the component. Additionally, the flexible substrate should be erosion resistant so that strain gauge 10 on the flexible substrate stays on the component for the component lifetime. This is highly dependent on the specific component and ink chosen. For example, if the component is the leading edge of a wing, the flexible substrate must be able to withstand light, temperature, and weather external to the aircraft. In contrast, if the component is a heated floor panel, the flexible substrate needs to withstand the heater within the floor panel and the pressure of passengers stepping on the panel.

Next, the conductive ink is printed onto the substrate. Typically, ink-jet, aerosol-jet, or screen printing can be used depending on the type of ink chosen. For ink-jet and aerosol-jet methods, the print head should be moveable at least on (x, y, z) axes and programmable with the geometric pattern specific to the component on which the strain gauge will be applied. The specific print heat and printing method will be dependent on the exact ink formulations and requirements set forth by the manufacturer of the ink. A popular aerosol-jet equipment manufacturer, Optomec, has developed equipment and parameters specialized for precise application of very fine features at well controlled thicknesses that facilitate the subject invention. Printing head temperatures, flow rates, pressures, and orifice sizes are selected based on the ink being printed as well as the substrate to which the ink is applied. In a similar manner, ink-jet equipment manufacturers have optimized parameters of printing heads to allow precision printing of conductive inks. Ink-jet equipment has historically been utilized in a 2D manner, but has recently been adapted to 3D printing equipment used for additive manufacturing, such as equipment manufactured by Ultimaker or by means of attaching an ink-jet printing head to a numerically controlled robotic arm.

The printing is accomplished in an additive manner, meaning the print head takes multiple passes before a desired thickness of ink is reached in the correct geometric pattern, which matches the curvature of the component.

Printed strain gauge 10 should have a thickness of approximately between 20 and 300 microns, or preferably between 50 and 100 microns. Multiple passes are done by the print head when applying the conductive ink. Multiple passes allows for slow build of the conductive ink to the correct thickness and geometric pattern. Additionally, multiple passes allows for tailoring of the conductive ink on certain portions of the component surface. For instance, ink with a higher thickness and differing resistance may be printed on a first portion of the component compared to a second portion of the component.

After printed, the ink is cured, and leads 12, 14, are connected to terminals 18, 20. The curing process of additively manufactured strain gauge 10 depends on the type of ink used. In some instances, the ink will air dry. In other instances, heat, infrared exposure, UV exposure, or other methods must be used to set and cure the conductive ink.

After strain gauge 10 is printed onto the substrate, it is encapsulated with a dielectric material, such as acrylic, neoprene, polyurethane, polyimide, silicone, or an epoxy-fiberglass matrix, to prevent erosion and electrical shorting. A typical encapsulating material with high dielectric strength, such as polyimide (DuPont Kapton®)), may only be required to be 0.001" thick while materials with lower dielectric strength, such as polyurethane or neoprene rubber, may be as thick as 0.015-0.020". The encapsulating material can then be cured through conventional methods.

Finally, strain gauge 10 is applied to the component surface with an adhesive such as a pressure sensitive adhesive, epoxy, or cement adhesive, depending on the component and environment requirements. The flexible substrate allows for conforming of strain gauge 50 to curvature of the component surface without creating unnecessary stresses within strain gauge 50. The use of a flexible substrate allows strain gauge 10 to form to the shape of the surface of the component to which it is applied.

In the second method, the conductive ink is additively manufactured directly onto the component surface. In some instances, where the component is a conductive material (e.g., metallic), an intermediary dielectric layer must first be applied to the surface of the component before the conductive ink is printed. This layer may be a supplemental substrate bonded to the surface, but preferably it is a non-conductive ink that is applied via the same method being used to print the strain gauge.

If the conductive ink is printed directly onto the component surface, the printing method used must allow for a print head that can move in three dimensions and navigate the geometry of the component surface while printing. Like the first method, the print head will make multiple passes until the resistance and thickness of strain gauge 50 is correct. Methods such as screen printing, ink-jet or aerosol-jet printing can be used, the preferred method would be selected based on the complexity of the shape on which strain gauge 50 is being printed. The printing process is similar to that described in reference to the first embodiment. Once printed, strain gauge 50 must be electrically connected, encapsulated, and cured as discussed above.

In some instances, where the assembly surface is electrically conductive (metallic), this necessitates the use of an intermediary dielectric layer between the assembly and additively manufactured strain gauge 10, such as a non-conductive ink like DuPont BQ10 or ME777, or an integrally bonded layer such as polyimide (Kapton®)) or an epoxy-fiberglass. The typical thickness of a dielectric layer depends on the dielectric strength of the material and as a result may vary between 0.0005" and 0.010" thick. The dielectric layer is not necessary for certain types of composite surfaces. This dielectric layer is thin, and acts as an insulator and adhesive between the component surface and the additively manufactured strain gauge. The dialectic layer, like the flexible substrate in the first embodiment, must be able to withstand temperatures, light, and other environmental factors so that additively manufactured strain gauge 10 maintains its adhesion to the component.

In either embodiment, strain gauge 10 adheres to and matches the geometry of the surface of the component to which it is applied. This allows for greater fatigue resistance over the lifespan of the component and strain gauge 10. Moreover, multiple applications of strain gauge 10 conductive ink allows for varying thickness and resistance of strain gauge 10 as needed on the component. Various embodiments of strain gauge 10 used in components are discussed with reference to FIGS. 2 and 3.

Figure 2:
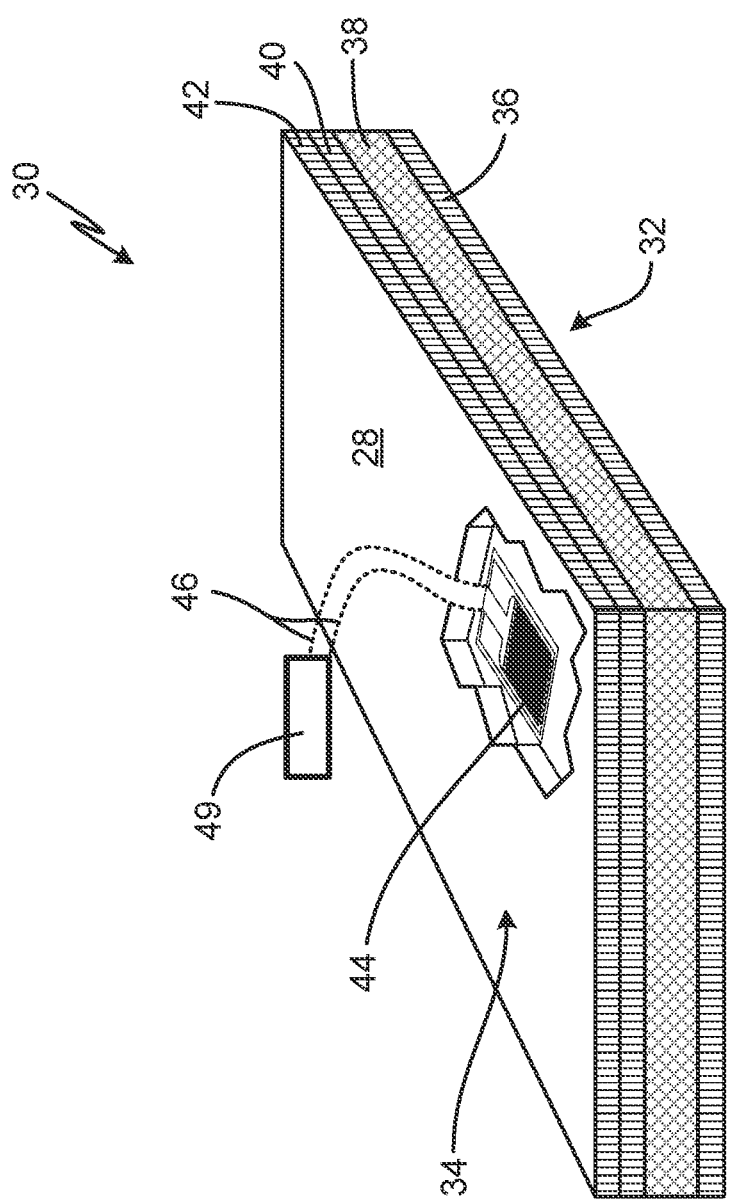
FIG. 2 is a perspective, cut-away view of a heated floor panel assembly with an additively manufactured strain gauge.

One embodiment includes a heated floor panel as depicted in FIG. 2. FIG. 2 is a perspective, cut-away view of heated floor panel assembly 30 with additively manufactured strain gauge 10. Heated floor panel assembly 30 has bottom surface 32 and top surface 34. Assembly 30 includes first stack of structural layers 36, core layer 38, heater layer 40, second stack of structural layers 42, strain gauge 10 additively manufactured inside assembly 30, flex leads 46 connected to strain gauge 10, skin layer 48, and controller 26.

Bottom surface 32 of heated floor panel assembly 30 is attached to an aircraft, while top surface 34 faces the inside of an aircraft cabin or other floor area needing to be heated. Components 36, 38, 40, 42, and 10 are arranged between bottom surface 32 and top surface 34. Heated floor panel assembly can optionally include additional structural layers and/or a skin layer, such as layer 48 which covers top surface 34 of assembly 30. Strain gauge 10 is nestled between second stack of structural layers 42 and skin layer 48.

In heated floor panel assembly 30, first and second stacks of structural layers 36 and 42 provide reinforcement to assembly 30. Core layer 38 provides impact resistance to assembly 30, and carries shear loads to stiffen floor panel assembly 30. Heating layer 40 can include an electrical heating element embedded on or in heating layer 40. Heating layer 40 can be used to control the temperature of top surface 34 of assembly 30, which can be installed, for example, in an aircraft cabin or cockpit. Additional and/or alternative structural layers can also be added in other embodiments.

Strain gauge 10 is additively manufactured inside heated floor panel assembly 30, between second stack of structural layers 42 and skin layer 48. Strain gauge is manufactured as described in reference to FIG. 1. Like strain gauge 10 in FIG. 1, strain gauge 10 is made of a conductive ink additively manufactured on the surface of assembly 30 and conforming to the geometry of assembly 30. Similarly, strain gauge 10 can reside on a flexible substrate which is attached to the curvature of assembly 30, or can be directly additively manufactured on assembly 30.

Skin layer 48 covers assembly 30 and protects strain gauge 10. Skin layer 48 can be, for example, a layer designed to absorb impact to assembly 30, such as a metallic or composite layer adhered to the outer surface of assembly 30.

Controller 26 is in communication with strain gauge 10 via flex leads 46. Controller 26 allows for reading of data from strain gauge 10 and is in communication with a controller capable of analyzing data to create a predictive model to determine when assembly 30 will fail or need replacement based on strain detected by strain gauge 10.

Controller 26 can include one or more processors and controller-readable memory encoded with instructions that, when executed by the one or more processors, cause controller 26 to operate in accordance with techniques described herein. Examples of the one or more processors include any one or more of a microprocessor, a digital signal processor (DSP), an application specific integrated circuit (ASIC), a field-programmable gate array (FPGA), or other equivalent discrete or integrated logic circuitry. Controller-readable memory of controller 26 can be configured to store information within controller 26 during operation. The controller-readable memory can be described, in some examples, as controller-readable storage media. In some examples, a controller-readable storage medium can include a non-transitory medium. The term "non-transitory" can indicate that the storage medium is not embodied in a substrate wave or a propagated signal. In certain examples, a non-transitory storage medium can store data that can, over time, change (e.g., in RAM or cache). Controller-readable memory of controller 26 can include volatile and non-volatile memories. Examples of volatile memories can include random access memories (RAM), dynamic random access memories (DRAM), static random access memories (SRAM), and other forms of volatile memories. Examples of non-volatile memories can include magnetic hard discs, optical discs, floppy discs, flash memories, or forms of electrically programmable memories (EPROM) or electrically erasable and programmable (EEPROM) memories. Controller 26 can be a stand-alone device dedicated to the operation of the catalytic oxidation unit, or it can be integrated with another controller.

Figure 3:
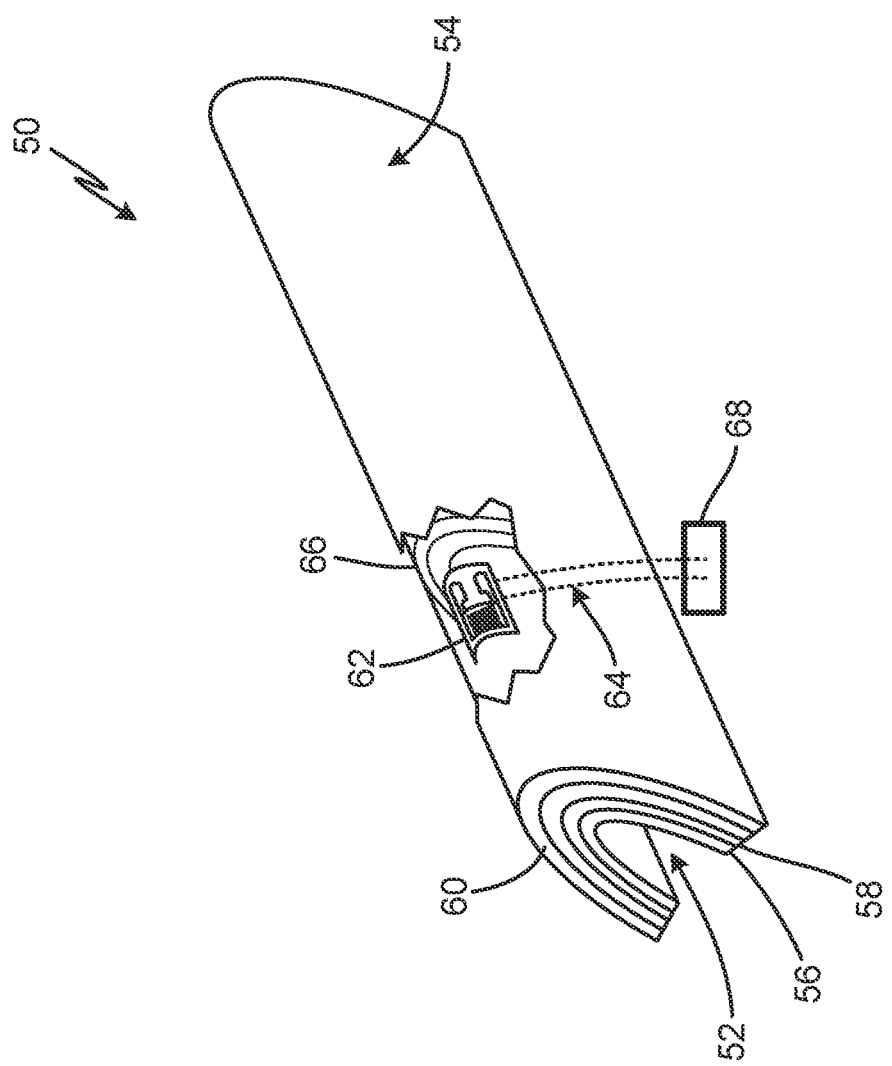
FIG. 3 is a perspective, cut-away view of a rotor blade component with an additively manufactured strain gauge.

FIG. 3 is a perspective, cut-away view of rotor blade component 50 with additively manufactured strain gauge 10. Component 50 has inner surface 52 and outer surface 54. Component 50 includes inner plies 56, heater layer 58, outer erosion shield 60, strain gauge 10, leads 64, and nonconductive outer ply 66.

Component 50 is a rotor blade for aircraft with a curved surface. Inner plies 56 make up the internal structure of component 50, providing structural support. Heater layer 58 internally heats component 50, and can be, for example, a metallic or carbon-based heating element. Nonconductive outer ply 56 protects and insulates heater layer 58 from strain gauge 10 or other external items. Erosion shield 60 protects all of component 50, including string gauge 10, from the external environment.

Strain gauge 10 is an additively manufactured strain gauge on the curved surface of component 50. Like strain gauge 10 in FIG. 2, strain gauge 10 is made of a conductive ink additively manufactured on the surface of component 50 and conforming to the geometry of component 50. Similarly, strain gauge 10 can reside on a flexible substrate which is attached to the curvature of component 50, or can be directly additively manufactured on component 50. Leads 64 connect strain gauge 10 to an electrical source and allow for communication with a controller as strain gauge 10 monitors strain on component 50.

The creation of an additively manufactured strain gauge on a component allows for predictive failure monitoring of that component. In determining a predictive model, stresses applied to a component are monitored with an additively manufactured stress gauge. In this step, a voltage is applied to the strain gauge. The resulting output voltage is measured, and a change in resistance is detected and use to calculate the strain applied to the component. This data regarding the stresses is transferred to a controller.

This allows the controller to predict failure of the component based on stresses detected over time. Ultimately, this allows for compiling of a model determining when to replace the component based on the analysis. Models that can predict component fatigue allow for regular maintenance and replacement schedules to be enforced.

Additively manufactured strain gauges have longer life than traditional metallic components due to the flexible nature of conductive ink and its components, in addition to flexible substrates. Printed strain gauges have longer lifespans than traditional wire or etched strain gauges, which allows for long term monitoring of component predictive failure monitoring.

Discussion of Possible Embodiments

The following are non-exclusive descriptions of possible embodiments of the present invention.

An assembly includes a component having a top surface, a strain gauge additively manufactured thereon, and a controller. The strain gauge includes an additively manufactured portion comprising a conductive ink defining a sensing portion and one or more terminals and an encapsulating material, and one or more flex leads connected to the one or more terminals. The controller is electrically connected to the printed portion through the one or more flex leads.

The assembly of the preceding paragraph can optionally include, additionally and/or alternatively, any one or more of the following features, configurations and/or additional components:

The component is selected from the group consisting of a rotor blade, a floor panel, a wing leading edge, a horizontal stabilizer, a vertical stabilizer, and a heated inlet.

The additively manufactured portion comprises a conductive ink selected from the group consisting of carbon loaded, nano-carbon load, and nano-silver loaded inks.

The additively manufactured portion comprises a plurality of lines, each of the plurality of lines having a thickness between 20 and 300 microns.

Each of the plurality of lines has a thickness between 50 and 100 microns.

The additively manufactured portion has a resistivity of between 0.01 and 20 ohms per square per MIL.

The additively manufactured portion has a resistivity of between 1 and 15 ohms per square per MIL.

The additively manufactured strain gauge is printed directly on the surface of the component.

The additively manufactured strain gauge is printed on a flexible substrate that is attached to the surface of the component.

The additively manufactured strain gauge is printed on a dielectric layer residing on the surface of the component.

A system for monitoring fatigue of a component includes an additively manufactured strain gauge on a first surface of a component, a controller for reading and analyzing data produced by the additively manufactured strain gauge, an electrical connection between the additively manufactured strain gauge and the controller, and a predictive program on the controller for predicting when the component will fail based on data from the additively manufactured strain gauge.

A method of making a strain gauge on a component includes additively manufacturing a gauge onto a first surface of the component and electrically connecting the gauge to an external controller.

The method of the preceding paragraph can optionally include, additionally and/or alternatively, any one or more of the following features, configurations and/or additional components:

Additively manufacturing the gauge comprises printing multiple layers of the gauge.

Additively manufacturing the gauge comprises printing with a carbon loaded or silver loaded ink.

Additively manufacturing the gauge comprises printing the gauge during manufacture of the component.

Electrically connecting the gauge comprises attaching one or more leads between the gauge and the external controller.

Encapsulating the strain gauge.

Additively manufacturing the gauge comprises screen printing, ink-jet printing, or aerosol printing the gauge.

Additively manufacturing the gauge comprises printing with a carbon loaded or silver loaded ink.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of making a strain gauge on a component comprising:
   additively manufacturing a dielectric layer directedly onto a first surface of the component, wherein the dielectric layer comprises a non-conductive ink, the dielectric layer is between 0.0005 inches and 0.010 inches thick, and the dielectric layer is printed onto the first surface;
   additively manufacturing the strain gauge onto the dielectric layer by printing the strain gauge directly onto the dielectric layer; and
   electrically connecting the strain gauge to an external controller, wherein the external controller is configured to read and analyze data produced by the strain gauge and the external controller further comprises a predictive program for predicting when the component will fail based on data produced by the strain gauge;
   wherein the component is a portion of a heated floor panel assembly that comprises:
   a first stack of structural layers;
   a core layer;
   a heater layer;
   a second stack of structural layers; and
   a skin layer,
   wherein the dielectric layer is additively manufactured directedly onto a surface of the second stack of structural layers and the strain gauge is additively manufactured directly onto the dielectric layer such that the dielectric layer and strain gauge are positioned between the second stack of structural layers and the skin layer.

2. The method of claim 1, wherein additively manufacturing the strain gauge comprises printing the strain gauge during manufacture of the component.

3. The method of claim 1, wherein electrically connecting the strain gauge comprises attaching one or more leads between the strain gauge and the external controller.

4. The method of claim 1, further comprising encapsulating the strain gauge.

5. The method of claim 1, wherein additively manufacturing the strain gauge comprises screen printing, ink-jet printing, or aerosol printing the strain gauge.

6. The method of claim 1, wherein additively manufacturing the strain gauge comprises printing with a carbon loaded or silver loaded ink.

7. A heated floor panel assembly comprising:
a first stack of structural layers;
a core layer;
a heater layer;
a second stack of structural layers; and
a skin layer;
wherein a dielectric layer is additively manufactured directedly on a surface of the second stack of structural layers and a strain gauge is additively manufactured directly on the dielectric layer such that the dielectric layer and strain gauge are positioned between the second stack of structural layers and the skin layer;
wherein the dielectric layer comprises a non-conductive ink and the dielectric layer is between 0.0005 inches and 0.010 inches thick; and
the strain gauge comprises:
an additively manufactured portion comprising:
a conductive ink defining a sensing portion and one or more terminals; and
an encapsulating material; and
one or more flex leads connected to the one or more terminals; and
a controller electrically connected to the additively manufactured portion through the one or more flex leads.

8. The heated floor panel assembly of claim 7, wherein the controller is configured to read and analyze data produced by the strain gauge and the controller further comprises a predictive program for predicting when the heated floor panel assembly will fail based on data from the strain gauge.

9. A rotor blade assembly comprising:
inner plies,
a heater layer,
an outer erosion shield, and
a nonconductive outer ply,
wherein a dielectric layer additively manufactured directedly on a surface of the outer erosion shield and a strain gauge is additively manufactured directly on the dielectric layer such that the dielectric layer and strain gauge are positioned between the outer erosion shield and the nonconductive outer ply;
wherein the dielectric layer comprising a non-conductive ink, wherein the dielectric layer is between 0.0005 inches and 0.010 inches thick; and
the strain gauge comprises:
an additively manufactured portion comprising:
a conductive ink defining a sensing portion and one or more terminals; and
an encapsulating material; and
one or more flex leads connected to the one or more terminals; and
a controller electrically connected to the additively manufactured portion through the one or more flex leads.

10. The rotor blade assembly of claim 9, wherein the controller is configured to read and analyze data produced by the strain gauge and the controller further comprises a predictive program for predicting when the rotor blade assembly will fail based on data from the strain gauge.

11. A method of making a strain gauge on a component comprising:
additively manufacturing a dielectric layer directedly onto a first surface of the component, wherein the dielectric layer comprises a non-conductive ink, the dielectric layer is between 0.0005 inches and 0.010 inches thick, and the dielectric layer is printed onto the first surface;
additively manufacturing the strain gauge onto the dielectric layer by printing the strain gauge directly onto the dielectric layer; and
electrically connecting the strain gauge to an external controller, wherein the external controller is configured to read and analyze data produced by the strain gauge and the external controller further comprises a predictive program for predicting when the component will fail based on data produced by the strain gauge;
wherein the component is a portion of a rotor blade that comprises:
inner plies;
a heater layer;
an outer erosion shield; and
a nonconductive outer ply,
wherein the dielectric layer is additively manufactured directedly onto a surface of the outer erosion shield and the strain gauge is additively manufactured directly onto the dielectric layer such that the dielectric layer and strain gauge are positioned between the outer erosion shield and the nonconductive outer ply.

12. The method of claim 11, wherein additively manufacturing the strain gauge comprises printing the strain gauge during manufacture of the component.

13. The method of claim 11, wherein electrically connecting the strain gauge comprises attaching one or more leads between the strain gauge and the external controller.

14. The method of claim 11, further comprising encapsulating the strain gauge.

15. The method of claim 11, wherein additively manufacturing the strain gauge comprises screen printing, ink-jet printing, or aerosol printing the strain gauge.

16. The method of claim 11, wherein additively manufacturing the strain gauge comprises printing with a carbon loaded or silver loaded ink.

* * * * *